(12) United States Patent
Platzer Björkman et al.

(10) Patent No.: US 8,865,512 B2
(45) Date of Patent: Oct. 21, 2014

(54) THIN-FILM SOLAR CELL

(75) Inventors: Charlotte Platzer Björkman, Uppsala (SE); John Kessler, Uppsala (FR); Lars Stolt, Uppsala (SE)

(73) Assignee: Solibro Research AB, Uppsala (SE)

( * ) Notice: Subject to any disclaimer, the term of this patent is extended or adjusted under 35 U.S.C. 154(b) by 978 days.

(21) Appl. No.: 12/788,963

(22) Filed: May 27, 2010

(65) Prior Publication Data

US 2010/0233841 A1 Sep. 16, 2010

Related U.S. Application Data

(62) Division of application No. 10/555,792, filed as application No. PCT/SE2004/000689 on May 5, 2004, now abandoned.

(30) Foreign Application Priority Data

May 8, 2003 (SE) ........................................ 0301350

(51) Int. Cl.
*H01L 21/20* (2006.01)
*H01L 31/0749* (2012.01)
*H01L 31/032* (2006.01)

(52) U.S. Cl.
CPC ........ *H01L 31/0322* (2013.01); *H01L 31/0749* (2013.01); *Y02E 10/541* (2013.01)
USPC ..................................... 438/85; 257/E31.027

(58) Field of Classification Search
CPC ............ H01L 31/0322; H01L 31/0749; Y02E 10/541
USPC .............................. 438/57, 83–85, 92–95, 98
See application file for complete search history.

(56) References Cited

U.S. PATENT DOCUMENTS

| | | | |
|---|---|---|---|
| 4,611,091 A | 9/1986 | Choudary et al. | |
| 5,078,804 A | 1/1992 | Chen et al. | |
| 5,948,176 A | 9/1999 | Ramanathan et al. | |
| 6,107,562 A * | 8/2000 | Hashimoto et al. | ........... 136/252 |
| 6,258,620 B1 | 7/2001 | Morel et al. | |
| 6,259,016 B1 | 7/2001 | Negami et al. | |

(Continued)

FOREIGN PATENT DOCUMENTS

| | | |
|---|---|---|
| CN | 1367536 | 9/2002 |
| DE | 44 40 878 | 7/1996 |

(Continued)

OTHER PUBLICATIONS

European Office Action, dated Nov. 9, 2011, in Application No. 04731270.7.

(Continued)

*Primary Examiner* — Savitr Mulpuri
(74) *Attorney, Agent, or Firm* — Young & Thompson

(57) ABSTRACT

Thin-film solar cells of the CIGS-type use two integrally formed buffer layers, a first ALD Zn(O,S) buffer layer on top of the CIGS-layer and a second ALD ZnO-buffer layer on top of the first buffer layer. Both buffer layers are deposited in the same process step using ALD (atom layer deposition). The technology also relates to a method of producing the cell and a process line for manufacturing of the cell structure.

19 Claims, 4 Drawing Sheets

(56) References Cited

U.S. PATENT DOCUMENTS

| | | | |
|---|---|---|---|
| 7,019,208 B2* | 3/2006 | Delahoy | 136/252 |
| 7,151,008 B2* | 12/2006 | Ashton et al. | 438/102 |
| 2004/0004245 A1* | 1/2004 | Forbes et al. | 257/315 |
| 2004/0063320 A1 | 4/2004 | Hollars | |
| 2005/0183767 A1* | 8/2005 | Yu et al. | 136/263 |
| 2007/0004224 A1* | 1/2007 | Currie | 438/778 |

FOREIGN PATENT DOCUMENTS

| | | |
|---|---|---|
| EP | 0 838 863 | 4/1998 |
| JP | 11-330507 | 11/1999 |
| JP | 2000323733 | 11/2000 |
| JP | 2000323733 A | 11/2000 |
| JP | 2003179237 A | 6/2003 |

OTHER PUBLICATIONS

Ohtake et al., Development of ZnO/ZnSe/CuIn$_{1-x}$Ga$_x$Se$_2$ Thin-Film Solar Cells with Band Gap of 1.3 to 1.5 eV, Conference Record of the Twenty Fourth IEEE Photovoltaic Specialists Conference, Dec. 1994, vol. 1, pp. 218-221.

Meng et al., "Structural, optical and electrical properties of ZnO and ZnO-Al2O3 films prepared by dc magnetron sputtering", Applied Physics, 2000, A. 70, pp. 421-424.

Yousfi et al., "Cadmium-free buffer layers deposited by atomic later epitaxy for copper indium diselenide solar cells", Thin Solid Films 361-362, 2000, pp. 183-186.

European Office Action, dated Jun. 6, 2011, in Application No. 04731270.7.

* cited by examiner

THIN-FILM SOLAR CELL

CROSS REFERENCE TO RELATED APPLICATIONS

This application is a divisional of co-pending application Ser. No. 10/555,792 filed on Nov. 7, 2005, which is the 35 U.S.C. §371 national stage of International PCT/SE04/00689 filed on May 5, 2004, which claims priority to Swedish Application No. 0301350-5 filed on May 8, 2003. The entire contents of each of the above-identified applications are hereby incorporated by reference.

TECHNICAL AREA

The present invention relates to a thin-film solar cell without cadmium, to a method and production line for manufacturing such cells.

BACKGROUND OF THE INVENTION

Solar cells provide a means to produce electric power with minimal environmental impact because it is a renewable technology. In order to become a commercial success the solar cells need to be efficient, to have low cost, to be durable, and not add other environmental problems.

Today's dominant solar cell technology is based on crystalline silicon. It fulfils many of the requirements mentioned above but can not be produced at such low cost that electricity generation in large scale is cost effective. It also requires relatively large amount of energy in the production, which is an environmental disadvantage.

Solar cells based on thin film technologies have been developed. They offer a potential of substantial cost reductions but have, in general, lower conversion efficiencies and less good durability. A very promising thin film solar cell technology is based on the semiconductor $Cu(In,Ga)Se_2$, abbreviated CIGS, which has demonstrated high efficiencies (16.6% in small prototype modules [1]) and durability in operation. It remains to demonstrate low cost in real production.

CIGS-solar cells are thin-film solar-cells with a CIGS-layer serving as absorber of sunlight. Electron-hole-pairs are generated therein.

A typical CIGS-solar cell is shown in FIG. 1 and comprises a glass substrate 1 with a thickness of 2-3 mm, an Mo-back contact 2 with a thickness of 0.5-1 μm, a CIGS-layer 3 of 1.5-2 μm, a CdS buffer layer 4 with a thickness of 50 nm and a ZnO window layer 5 of 0.5-1 μm. An optional second buffer layer 6 may be present between the CdS buffer layer and the window layer and has a thickness of 50 nm.

The CIGS-layer is a p-conductive $Cu(In,Ga)(Se,S)_2$ compound. The CdS buffer layer serves as protection of the CIGS-layer. The window layer is a n-type conductive doped zinc oxide layer. With the CIGS-layer it forms a pn-junction and serves as a transparent front contact. The optional second buffer layer comprises non-doped ZnO. Presently its role is not fully understood. Statistically seen, solar cells with this second buffer layer exhibit better properties compared to cells with a single ZnO-layer.

The commonly used way of fabricating CIGS solar cell modules include formation of a pn-junction and front contact according to the following: (1) a buffer layer (typically 50 nm of CdS) is deposited by chemical bath deposition (CBD), (2) a high resistivity thin layer of ZnO is deposited on top of the CdS layer by sputtering, (3) the layered structure is patterned by mechanical scribing to open contacts for the serial interconnects, (4) a front contact of a transparent conductive oxide (TCO) is deposited, and (5) an additional patterning step of mechanical patterning as part of the interconnect structure.

EP-A2-0 838 863 discloses a thin-film solar cell fabricated on a glass substrate. The solar cell comprises a metallic back electrode, a light-absorbing layer having on its surface a $Cu(InGa)(Se)_2$ layer (CIGS layer), an interfacial layer referred to as a buffer layer, a window layer and an upper electrode. The back electrode is a p-type semiconductor and the window layer is an n-type semiconductor. Between the back and upper electrodes an open circuit voltage in the order of 0.2-0.8 V is obtained when the solar cell is hit by light. Electrical current will be generated in the p-n junction between the p- and n-layers.

The buffer layer comprises a group II-VI compound semiconductor containing hydroxyl groups. An exemplary compound is $Zn(O,S,OH)_2$.

DE 44 40 878 C2 discloses a thin-film solar cell comprising a glass substrate, a back electrode, a light absorbing layer, a front buffer layer and a window layer. The front buffer layer comprises a mixture of $In(OH)_3$ and $In_2S_3$ and is applied in a wet process or a chemical vapour deposition process (CVD) with organo metallic compounds or with atomic layer epitaxy deposition process (ALE). The novel concept here is that the buffer layer does not contain cadmium.

To fabricate the solar cell with chemical wet process steps mixed with sputtering makes the solar cell less attractive for large scale production. To fabricate the solar cell wet processes are mixed with the co-vapour deposition process which renders the structure less attractive for large scale production.

An example of thin-film solar cells using a first CdZnS buffer layer between a CIGS-layer and a window layer is disclosed in U.S. Pat. No. 5,078,804. A second ZnO buffer layer on top of the first buffer layer and in contact with the window layer is also provided. The first CdZnS buffer layer comprises two layers, a high Zn content CdZnS layer on top of a low Zn content CdZnS layer, both of which are applied using an aqueous solution method. The second ZnO buffer layer also comprises two layers, a low resistivity ZnO layer on top of a high conductivity ZnO layer both of which are applied using sputtering in an argon or oxygen/argon atmosphere.

To manufacture the solar cell with chemical wet process steps mixed with sputtering makes the solar cell less attractive for large scale production. The use of toxic cadmium makes the cell less attractive for environmental reasons. Also handling and disposal of the hazardous wastes are costly.

U.S. Pat. No. 5,948,176 discloses a solar cell structure comprising a first active CIGS layer on top of a metal back contact. On top of the CIGS layer a buffer layer of n-type conductive doped ZnO layer is deposited by a wet process using a zinc chloride solution as doping source. A second active layer comprising ZnO is deposited on the buffer layer. The second active layer comprises a first high resistive ZnO layer and a second low resistive ZnO layer on top of which a grid of front face electrodes is sputtered.

Another example of a cadmium containing solar cell is shown in U.S. Pat. No. 4,611,091.

SUMMARY OF THE INVENTION

One object of the invention is to reduce the number of process steps for the manufacture of the solar cell, thereby reducing the cost involved in their manufacture.

Another object of the invention is to replace the toxic CdS-layer with more environmental-friendly compound.

Still another object of the invention is to replace the CdS-layer with a material that absorbs less of the incident light than does a CdS-layer, thereby increasing the amount of light impinging the under-laying CIGS-layer and accordingly increasing the photo current generated by the cell.

A further object of the invention is to replace the wet process for manufacture of the CdS-buffer layer with a novel process that allows for integration with the preceding (dry) vacuum deposition of the CIGS-layer and/or integration with the following (dry) sputter deposition of the high resistivity ZnO window layer.

These objects are achieved with a thin-film solar cell indicated in the preamble of claim 1, a method of producing an interfacial layer in accordance the preamble of claim 7 and a process line for manufacturing a solar cell structure in accordance with the preamble of claim 14. The characteristic features of the invention are indicated in the characterizing clause of claims 1, 7 and 14 respectively.

DESCRIPTION OF THE PREFERRED EMBODIMENTS

Figure 1:
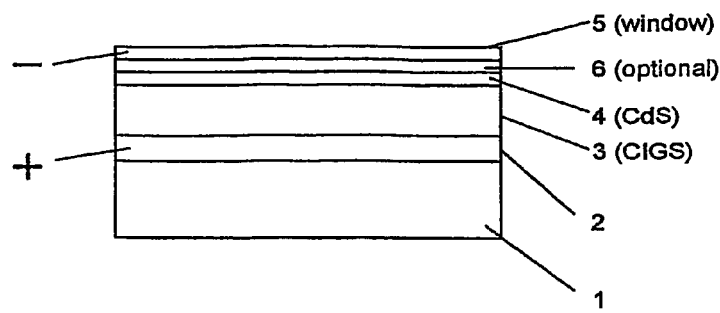
FIG. 1 is a simplified sectional view of a known, typical CIGS solar cell structure.
Figure 2:
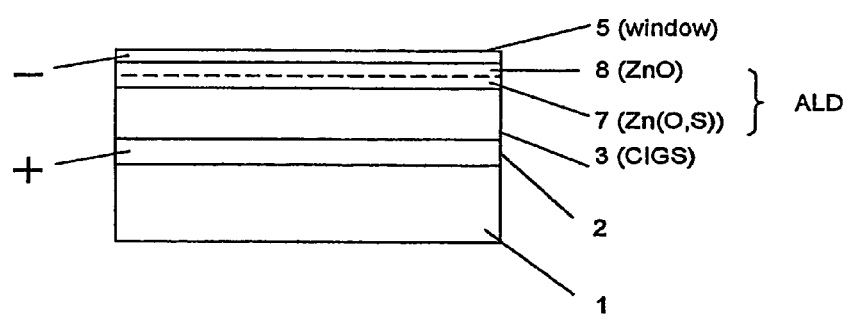
FIG. 2 is sectional view of a CIGS solar cell structure with two ALD buffer layers in accordance with the invention.

A CIGS-cell in accordance with the present invention is shown in FIG. 2. It comprises the usual glass substrate 1, the back contact layer 2 of molybdenum, the CIGS-layer 3 and the window layer 5. The usual CdS-buffer layer is replaced with two buffer layers, a first buffer layer containing Zn(O,S) deposited on the CIGS-layer and a second buffer layer 8 deposited on the first one and containing ZnO.

This is done in one process step in accordance with the invention. At first the Zn(O,S)-layer is deposited by atomic layer deposition (ALD) and immediately following this the ZnO-layer is deposited by ALD in the same process chamber. In effect, it can be considered that the two layers are replaced with one single layer of Zn(O,S), where no sulphur is added during the latter part of the deposition.

It is the inventive ALD deposition in the same chamber that makes possible the combination of a Zn(O,S)-layer and a ZnO-layer.

The function of the Zn(O,S)-layer is to make the surface of the under-laying active CIGS-layer electronically passive. The CIGS-layer surface contains defects that are active unless the Zn(O,S)-layer is not present. They also have a negative influence on the properties of the under-laying CIGS-layer. The Zn(O,S)-layer will make these defects electronically passive and will to a great extent, if not completely, reduce their influence on the CIGS-layer. At present it is not fully understood what other properties and functions the Zn(O,S)-layer has.

The function of the ZnO-layer is to physically protect the under-laying very thin Zn(O,S) layer. The thickness of the Zn(O,S)-layer is less than about 30 nm (=30×10$^{-9}$ m or 300 Å). Experiments have shown that the thickness of the ZnO-layer does not appear to be critical; its thickness is generally about 50-100 nm.

The ZnO- and Zn(O,S)-layers are in this embodiment of the invention two separate, distinct layers. The ZnO-layer is integrally formed with the sulphur containing Zn(O,S)-layer and vice versa. Together the two layers appear as a single unit.

Figure 3:
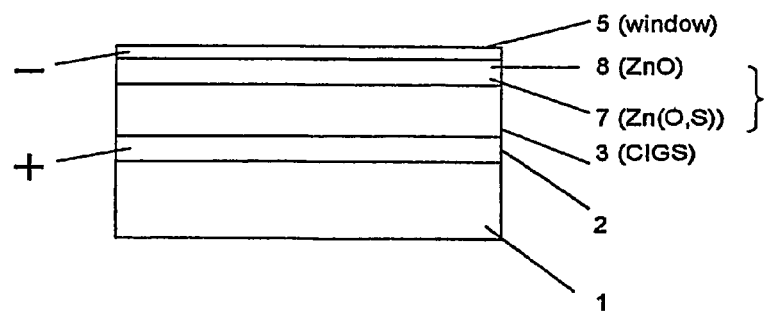
FIG. 3 is a sectional view of a solar cell structure in accordance with the invention wherein the lower of the two ALD buffer layers has a sulphur gradient.

In a second embodiment shown in FIG. 3 the sulphur content of the upper part of Zn(O,S)-layer gradually decreases and finally vanishes, indicating the first monolayer of a ZnO-layer of the desired thickness. In other words there is a sulphur gradient over the thickness of the combined ZnO- and Zn(O,S)-layers. In this embodiment there are no distinct layers but the Zn(O,S)-layer transforms into the ZnO-layer, and vice versa. Nevertheless, the Zn(O,S)-layer is integral with ZnO-layer.

Figure 4:
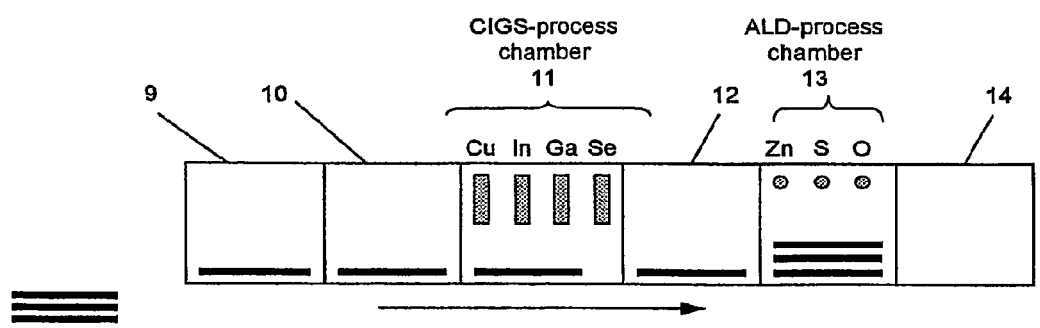
FIG. 4 is a schematic side view of a production line for the manufacture of a solar cell in accordance with the invention.

The ALD process for deposition of the Zn(O,S)- and ZnO-layers is in accordance with another aspect of the present invention integrated with a preceding process for deposition of the CIGS-layer. In FIG. 4 a production line in accordance with the invention for manufacturing a solar cell structure of the invention is shown to comprise a conventional CIGS-production line comprising inlet chamber 9, a transport and heating chamber 10, a CIGS-process chamber 11, a transport and cooling chamber 12, and an outlet lock chamber 13. In accordance with the invention the lock chamber is used as ALD process chamber for deposition of the ZnO- and Zn(O,S)-layers. Following the ALD process chamber there is an optional exit lock 14. The exit lock may also be a part of the ALD chamber.

Substrates provided with the sputtered back contact Mo-layer are loaded one at a time into the inlet chamber. In the transport chamber they are accelerated and heated to about 500° C. They will thereby arrive in a serial stream, close together, to the CIGS-process chamber where they are deposited in sequence in line. The CIGS-process chamber has sources of Cu, In, Ga and Se for deposition of the CIGS-layer by vapour deposition. After growing the CIGS-layer to the desired thickness the substrates enter the transport and cooling chamber where they are cooled to the desired ALD-process temperature of about 120° C. in vacuum or in an inert environment before they enter the ALD-process chamber. In the ALD process chamber the substrates are processed in parallel as indicated in FIG. 4, or one by one.

The ALD process chamber has sources of H$_2$S, diethyl zinc and water. Each source comprises a valve through with the corresponding gaseous compound is injected into the process chamber for a predetermined time. A "pulse" of the corresponding gaseous compound will thus be given.

Before the ALD process starts, the ALD process camber is flushed with nitrogen gas so as to purge the reaction chamber.

The ALD process starts by injecting a pulse of diethyl zinc. On the surface of the CIGS-layer a monolayer of zinc containing molecules is absorbed. Thermodynamically the process is so controlled that a thin monolayer of Zn molecules will result at the temperature existing; no further mono layers will result even if additional diethyl zinc pulses are given.

Next a pulse of $H_2O$ or $H_2S$ is injected. Following this another pulse of diethyl zinc is injected. Next a pulse of $H_2O$ or $H_2S$ is given. This will result in the growth of oxygen and sulphur on the monolayer containing zinc molecules. A first monolayer of Zn(O,S) results.

These steps are cycled to grow additional Zn(O,S) monolayers on top of each other until the first Zn(O,S)-layer of the desired thickness is obtained. The mono-layers will grow in a very controlled manner and they grow over edges down into pits and irregularities that may exist in the CIGS-layer.

The thickness of the Zn(O,S)-layer is controlled by selecting the number of cycles diethyl zinc pulses alternating with water and $H_2S$.

Each second pulse is thus of diethyl zinc and between these pulses of $H_2O$ and $H_2S$ are injected. Expressed in another way one can say that pulses of diethyl zinc are alternating with pulses of $H_2O$ and $H_2S$. The order in which $H_2O$ and $H_2S$ alternate need not be $H_2O$—$H_2S$—$H_2O$—$H_2S$ etc. but may vary. For example one pulse of $H_2S$ may be followed of several pulses of $H_2O$ in a row. Further, the scheme according to which pulses of $H_2O$ and $H_2S$ are injected need not be regular, but may vary.

Although not described above it should be understood that the ALD process chamber has to be cleaned before a pulse of a new compound is injected. To this end the ALD process chamber is flushed with nitrogen gas.

Applicant has found that the first pulses of diethyl zinc may not adhere to the CIGS-layer. For this reason it is important to prevent the substrates from being exposed to the atmosphere during their transport from the CIGS process chamber to the ALD process chamber.

It appears to exist an incubation time until the Zn(O,S)-layer starts to grow on the CIGS-layer. It is vital that each pulse of a compound shall cover the entire area of the substrate and be allowed to react with the uppermost monolayer thereon. The reaction will saturate if the pulse is sufficiently long. Therefore the duration of each pulse must be adapted to achieve this. Once a monolayer starts to grow it will grow to the same thickness over the entire surface of the under-laying layer. The reaction is thus self-regulating and the process is cycled until the desired thickness of the Zn(O,S)-layer is achieved.

Applicant has found that a solar cell with having a coefficient of efficiency of 16% results if the following scheme is followed: every second pulse is always diethyl zinc; between the zinc pulses a total of five pulses of $H_2O$ and $H_2S$ are given, four of these being $H_2O$ and one being $H_2S$. For example:

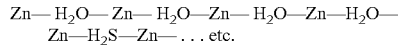

Zn—$H_2O$—Zn—$H_2O$—Zn—$H_2O$—Zn—$H_2O$—Zn—$H_2S$—Zn—... etc.

With the indicated figures $H_2S$ is given in a proportion of 1 to 5 (i.e. 20%) to the total number of water and $H_2S$ pulses. A solar cell of almost equal the same coefficient of efficiency is obtained if the proportion of $H_2S$ pulses to the total number of $H_2O$ and $H_2S$ pulses is 1:6 (17%).

Solar cells with an efficiency coefficient varying between 13-16% result if the $H_2S$ is given in a proportion from 10-100%, preferably in a proportion of 15-25% of the total number of water and $H_2S$ pulses. If the ratio of $H_2S$ pulses to $H_2O$ plus $H_2S$ pulses is 10% it is possible to obtain solar cells with a coefficient of efficiency in the order of about 15%. If $H_2S$ pulses only are given (corresponding to 100%) the resulting solar cell will have a coefficient of efficiency of 13%.

Applicant has thus found that the first buffer layer should comprise $Zn(O_x,S_{1-x})$, where x varies between 0 and 0.9, preferably between 0.1 and 0.7.

Another way of expressing the manner in which the Zn(O,S) buffer layer is grown is to say that pulses of diethyl zinc alternate with pulses of water; some of the latter being replaced with pulses of hydrogen sulphide. Thus, by varying the proportion of $H_2S$ pulses the properties of the resulting solar cell is controlled.

As indicated above the thickness of the Zn(O,S)-layer is less than about 30 nm. Applicant has found that excellent solar cells are obtained if the thickness is so thin as just 1 nm.

When the Zn(O,S)-layer of the predefined thickness has been grown the process is repeated, now without any pulses of $H_2S$, and the process continues to generate ZnO. Giving alternate pulses of diethyl zinc and water a first mono-layers of ZnO is grown on top of the surface of the Zn(O,S)-layer. Continuing to give alternate pulses of diethyl zinc and water additional mono-layers of ZnO will grow on top of each other and the process is cycled until a ZnO-layer of the desired thickness results.

Generally speaking the layers will grow at a controlled speed when the above indicated ALD process is followed. The duration of the pulses will depend on the volume of the ALD process chamber.

After completion of the ZnO-layer the substrates are transported to the exit lock from which they are delivered to a patterning station which is followed by a station for depositing the front contact and to a station for the additional patterning step as mentioned in the introductory portion of the description.

The above described ALD method is well suited for deposition of the combined Zn(O,S) and ZnO sulphur gradient layer shown in FIG. 3. At the end of the process for growing the Zn(O;S)-layer the number of $H_2S$ pulses is gradually decreased mono-layer for mono-layer until no $H_2S$ pulses is present. Finally diethyl zinc pulses alternating with water pulses only are injected thereby continuing to build ZnO-monolayers on top of each other until the desired thickness of the ZnO-layer is achieved.

The process line described above is harmonized in that the vacuum deposition process for growing the CIGS-layer and the ALD processes for growing the two Zn(O,S) and ZnO-layers all are dry processes.

Further Embodiments of the Invention

Instead of diethyl zinc it is possible to use dimethyl zinc or another organo metallic zinc compound. It is also possible to use a organo metallic indium compound.

Applicant has found that if the substrates in the ALD chamber have a temperature of about 120° C. the two buffer layers can be grown at this temperature.

The Zn(O,S)-layer can be deposited at a temperature of 160° C., and the ZnO-layer at 120° C. Although a temperature of 120° C. of the substrates in the ALD process chamber is preferred, the two buffer layers may be deposited at a temperature as high as about 250° C. and it may also be as low as 100° C. A preferred temperature range is 100-130° C. for the two buffer layers 7, 8.

Figure 5:
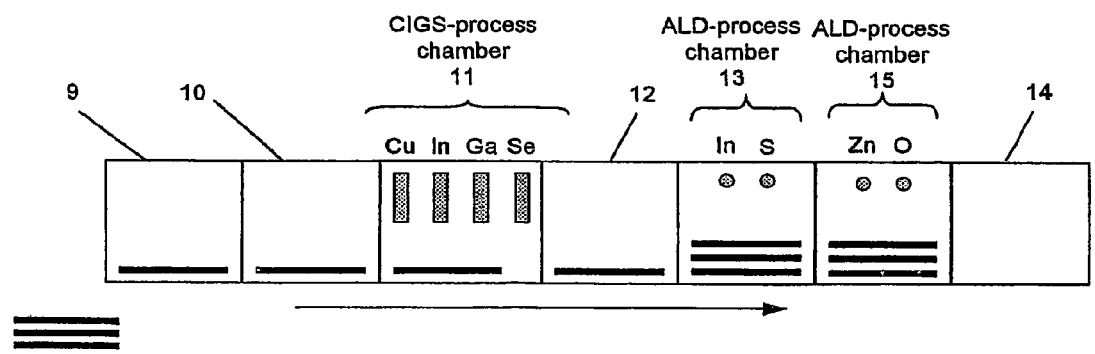
FIG. 5 is an alternative embodiment of the production line shown in FIG. 4.

In an alternate embodiment of the process line shown in FIG. 5, there are two separate ALD process chambers 13 and 15 for the deposition of the respective buffer layers 7 and 8. If the two buffer layers are deposited at different temperatures each ALD process chamber is held at the respective temperature. This will increase the throughput since the cooling time of the substrates will be reduced compared to the case in which the substrates are allowed to cool in the same chamber before the ZnO-layer is deposited.

Above it has been indicated that the first buffer layer, i.e. the Zn(O,S)-layer, contains zincoxysulfide. During the ALD deposition process a secondary phase may develop, for example zinc hydroxide, and accordingly be present in the buffer layers.

According to a further embodiment of the invention the first buffer layer may comprise ALD deposited indiumsulfide $In_2S_3$ and the second buffer layer the usual ALD deposited ZnO as described above. The ALD deposited $In_2S_3$ is manufactured in the same manner as described above, replacing the diethyl zinc pulses with a organo metallic indium compound such as indium acetyl acetonate, $In(acac)_3$.

Figure 6:
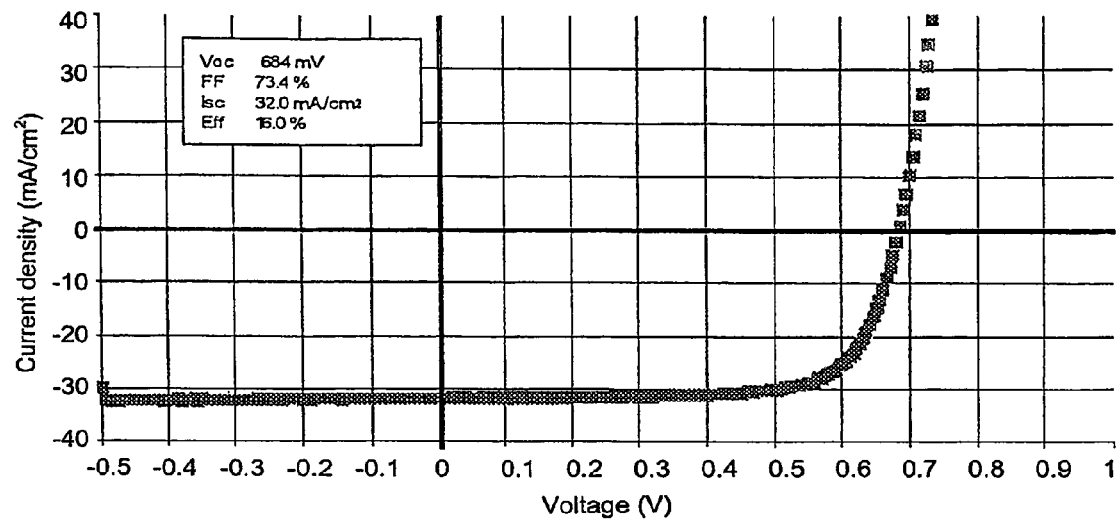
FIG. 6 is a diagram showing the efficiency of a CIGS solar cell with two ALD buffer layers in accordance with the invention

FIG. 6 is a current density ($mA/cm^2$)-voltage (V) graph of a solar cell provided with a first Zn(O,S)-buffer layer and a second ZnO-buffer layer in accordance with the invention. Characteristic properties of the cell is a open circuit voltage $V_{OC}$ of 684 mV, a fill factor FF of 74%, a short circuit current $I_{SC}$ of 32.0 $mA/cm^2$ and an efficiency of 16.0%. The solar cell was provided with an anti-reflective coating. These properties demonstrate that the solar cell of the invention has an equal or even superior performance than a common CIGS-cell with a CdS-buffer layer.

Figure 7:
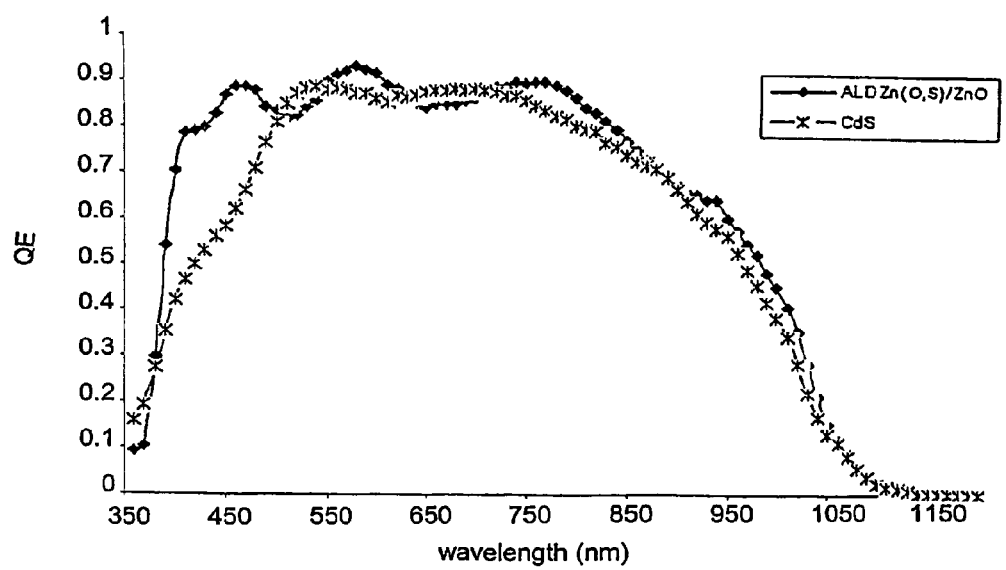
FIG. 7 is a diagram showing the quantum efficiency of the CIGS solar cell with two ALD buffer layers in accordance with the invention compared to a CIGS solar cell having just one CdS buffer layer.

FIG. 7 is a diagram showing the quantum efficiency QE at different wavelengths for a solar cell provided with a first Zn(O,S)-buffer layer and a second ZnO-buffer layer in accordance with the invention compared with a common CIGS-cell having a CdS-buffer layer. None of the cells had an anti-reflective layer. As appears the solar cell in accordance with the invention has a higher QE in the blue region of the spectrum.

Figure 8:
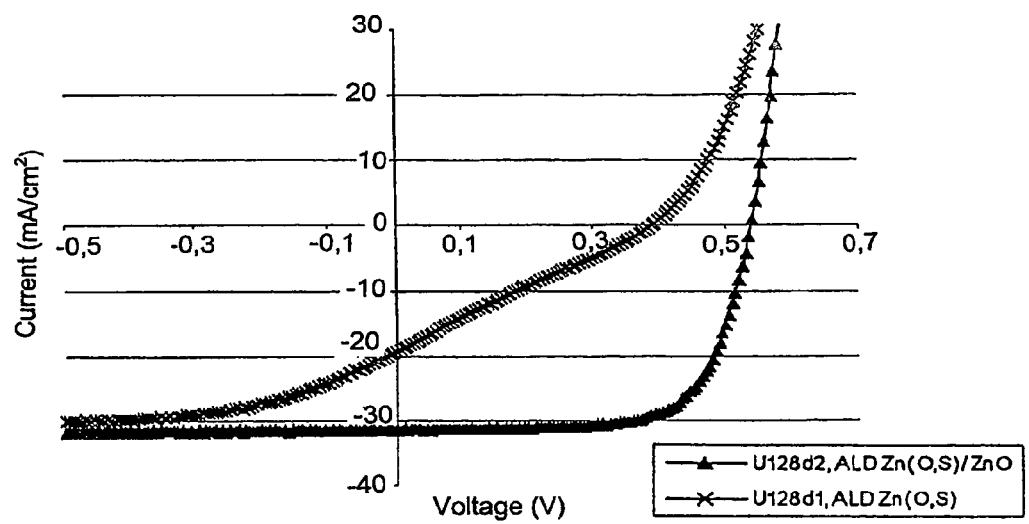
FIG. 8 is a diagram showing the efficiency of CIGS solar cell in accordance with the invention compared to a CIGS solar cell having just one ALD Zn(O,S) buffer layer.

FIG. 8 is a graph similar to that of FIG. 6 wherein a solar cell provided with a first Zn(O,S)-buffer layer and a second ZnO-buffer layer in accordance with the invention is compared to a solar cell having only the first Zn(O,S)-buffer layer. As appears from Table 1 below the cell having two buffer layers in accordance with the invention has superior properties

TABLE 1

|  | Voc (mV) | Isc ($mA/cm^2$) | FF (%) | Efficiency (%) |
| --- | --- | --- | --- | --- |
| U128d2, ALD Zn(O,S)/ZnO | 538 | 31.3 | 69.7 | 11.7 |
| U128d1, ALDZn(O,S) | 389 | 19.3 | 24.7 | 1.9 |

$I_{sc}$ is the short circuit current and FF is the fill factor.

Figure 9:
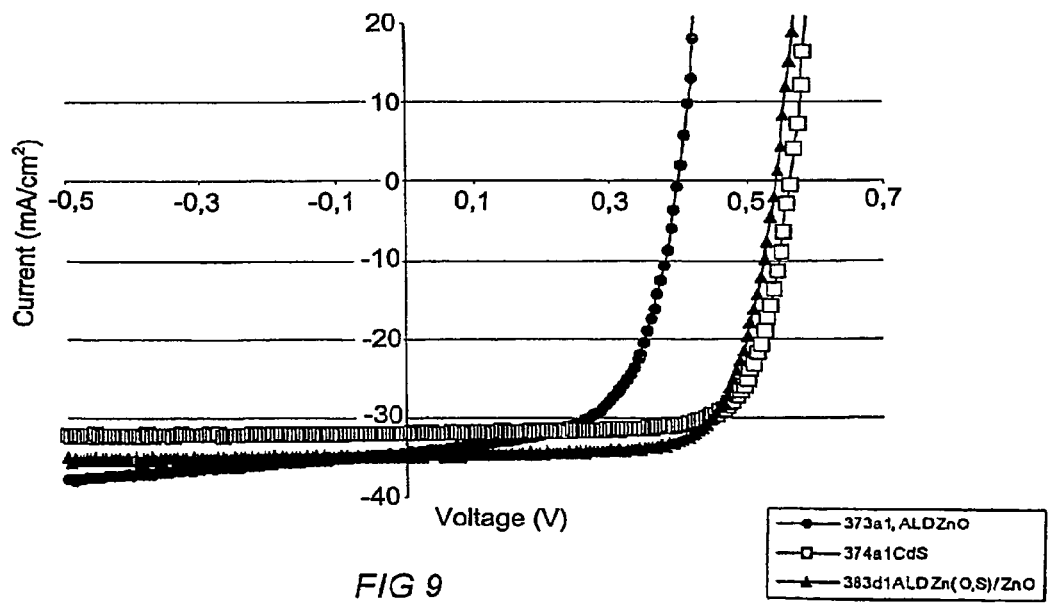
FIG. 9 is a diagram showing the efficiency of CIGS solar cell in accordance with the invention compared to a CIGS solar cell having just one ALD ZnO layer, and to a CIGS solar cell having just one CdS buffer layer.

FIG. 9 is a graph similar to the graph of FIG. 8 wherein a solar cell provided with a first Zn(O,S)-buffer layer and a second ZnO-buffer layer in accordance with the invention is compared to a common CIGS-cell using a single CdS-buffer layer and to a CIGS-cell with only the second ZnO-buffer layer. As appears from the properties listed in Table 2 below the cell in accordance with the invention has an equal performance with the CIGS-cell using a CdS-buffer layer.

TABLE 2

|  | Voc (mV) | Isc ($mA/cm^2$) | FF (%) | Efficiency (%) |
| --- | --- | --- | --- | --- |
| ALD ZnO | 401 | 34.4 | 60.7 | 8.4 |
| CdS | 566 | 32.0 | 74.6 | 13.5 |
| ALD Zn(O,S)/ZnO | 542 | 34.8 | 71.5 | 13.5 |

References

[1] M Green, K Emery, D King, S Igari and W Warta, *Solar Cell Efficiency Tables* (Version 21), Prog. Photovolt: Res. Appl. 2003; 11, p. 39-45

What is claimed is:

1. A method of forming an interfacial layer between a thin film of p-type semiconductor $Cu(In,Ga)(Se,S)_2$ light absorbing layer (CIGS-layer) and a thin film of n-type conductive window layer on a substrate of a thin film solar cell structure, comprising:
   vacuum deposition of the CIGS-layer in a CIGS process chamber;
   transporting the substrate with deposited CIGS-layer to an atomic layer deposition process chamber without exposing the substrate to an atmosphere; and
   providing said interfacial layer in the atomic layer deposition process chamber initially by depositing a first sulphur containing buffer layer on a surface of the CIGS-layer using atomic layer deposition and finally by depositing a second ZnO buffer layer on top of the first sulphur containing buffer layer using atomic layer deposition.

2. The method in accordance with claim 1, including forming the first sulphur containing buffer layer and the second ZnO buffer layer in one and the same atomic layer deposition process chamber.

3. The method in accordance with claim 1, including forming the first sulphur containing buffer layer and the second ZnO buffer layer in separate, but linked atomic layer deposition process chambers.

4. The method in accordance with claim 1, including providing the first sulphur containing buffer layer by exposing the CIGS-layer in the atomic layer deposition process chamber alternatively to pulses of an organo metallic zinc compound, diethyl zinc or dimethyl zinc to form a zinc containing monolayer or to pulses of water and $H_2S$ so as to grow oxygen and sulphur on the zinc atoms in order to form a first monolayer which is adsorbed on top of the CIGS-layer;
   repeating said steps to grow additional sulphur containing monolayers on top of each other; and
   continuing this process until the first sulphur containing buffer layer of a first predefined thickness is obtained.

5. The method in accordance with claim 4, including providing pulses of $H_2S$ in a proportion of 10-100%, 15-25%, or 10% to a total number water- and $H_2S$ pulses.

6. The method in accordance with claim 4, including providing the second ZnO buffer layer in a same manner as the first sulphur containing buffer layer leaving out the pulses of $H_2S$, by continuing to expose the first sulphur containing buffer layer in the atomic layer deposition process chamber alternatively to gas pulses of an organo metallic zinc compound, diethyl zinc or dimethyl zinc, and pulses of water until the second ZnO buffer layer of a second predefined thickness is obtained.

7. The method in accordance with claim 6, including successively decreasing said proportion of sulphur as said additional monolayers are grown so as to obtain a gradual transition of the first buffer layer into the second ZnO buffer layer.

8. A method of forming an interfacial layer between a thin film of p-type semiconductor $Cu(In,Ga)(Se,S)_2$ light absorbing layer (CIGS-layer) and a thin film of n-type conductive window layer on a substrate, comprising:
   vacuum deposition of the CIGS-layer in a CIGS process chamber; and, without exposing the substrate to an atmosphere,
   providing said interfacial layer by deposition of a first sulphur containing buffer layer on a surface of the CIGS-layer using atomic layer deposition and by deposition of a second ZnO buffer layer on top of the first sulphur containing buffer layer using atomic layer deposition.

9. The method in accordance with claim 8, wherein the first sulphur containing buffer layer comprises $ZnO_xS_{1-x}$.

10. The method in accordance with claim 9, wherein x is more than 0 and less than 0.9.

11. The method in accordance with claim 10, wherein x is more than 0.1 and less than 0.7.

12. The method in accordance with claim 8 wherein the thickness of the first sulphur containing buffer layer is larger than 1 nm and less than 30 nm.

13. The method in accordance with claim 8, wherein the first sulphur containing buffer layer comprises $In_2S_3$.

14. The method in accordance with claim 1, wherein before the atomic layer deposition the substrate is cooled to a desired atomic layer deposition temperature in a vacuum or an inert environment.

15. The method according to claim 14, wherein the desired atomic layer deposition temperature is about 120 ° C.

16. The method in accordance with claim 1, wherein before the atomic layer deposition starts, the atomic layer deposition process chamber is purged with nitrogen gas.

17. The method in accordance with claim 8, wherein before the atomic layer deposition the substrate is cooled to a desired atomic layer deposition temperature in a vacuum or an inert environment.

18. The method according to claim 17, wherein the desired atomic layer deposition temperature is about 120 ° C.

19. The method in accordance with claim 8, wherein before the atomic layer deposition starts, an atomic layer deposition process chamber is purged with nitrogen gas.

\* \* \* \* \*